United States Patent
Kim

(10) Patent No.: US 7,542,344 B2
(45) Date of Patent: Jun. 2, 2009

(54) NON-VOLATILE MEMORY DEVICE AND SELF-COMPENSATION METHOD THEREOF

(75) Inventor: Ki Seog Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 116 days.

(21) Appl. No.: 11/769,313

(22) Filed: Jun. 27, 2007

(65) Prior Publication Data

US 2008/0175055 A1    Jul. 24, 2008

(30) Foreign Application Priority Data

Dec. 27, 2006   (KR)  .................... 10-2006-0134812

(51) Int. Cl.
    *G11C 11/34*    (2006.01)
(52) U.S. Cl. ................. 365/185.12; 365/185.03; 365/185.24; 365/210.1; 365/210.11
(58) Field of Classification Search ............ 365/185.03, 365/185.11, 185.12, 185.23, 185.24, 210.1, 365/210.11
See application file for complete search history.

(56) References Cited

U.S. PATENT DOCUMENTS 7,020,037 B2 * 3/2006 Anzai et al. ............... 365/210.1

2004/0136220 A1 * 7/2004 Cohen ....................... 365/100
2007/0253249 A1 * 11/2007 Kang et al. ............. 365/185.03

FOREIGN PATENT DOCUMENTS

| JP | 09-306182 | 11/1997 |
| JP | 2005-182919 | 7/2005 |
| KR | 1020000004719 A | 1/2000 |
| KR | 1020010094723 A | 11/2001 |
| KR | 1020030073829 A | 9/2003 |
| KR | 1020040052409 A | 6/2004 |
| KR | 1020040059457 A | 7/2004 |

* cited by examiner

*Primary Examiner*—Tuan T Nguyen
*Assistant Examiner*—Toan Le
(74) *Attorney, Agent, or Firm*—Townsend and Townsend and Crew LLP

(57) ABSTRACT

A non-volatile memory device includes a memory cell array at least one block having a plurality of memory cells, and at least one reference cell with respect to each block, an X decoder and a Y decoder for selecting a memory cell for an operation according to an input address, a page buffer for programming data into a memory cell selected by the X decoder and the Y decoder or reading programmed data, and a controller for controlling the memory cell array, the X decoder, the Y decoder and the page buffers to calculate a change in a threshold voltage of the memory cells and compensate for a changed threshold voltage of a memory cell based on a change in a threshold voltage of the reference cell.

19 Claims, 9 Drawing Sheets

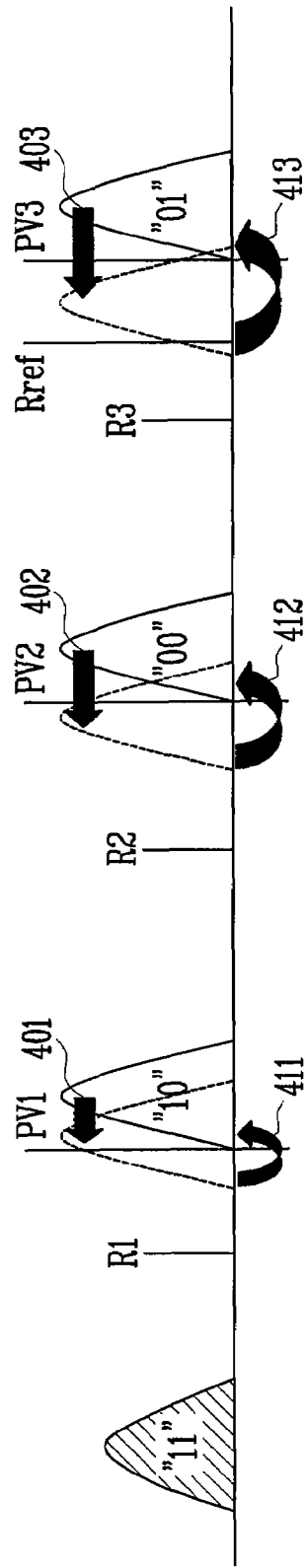

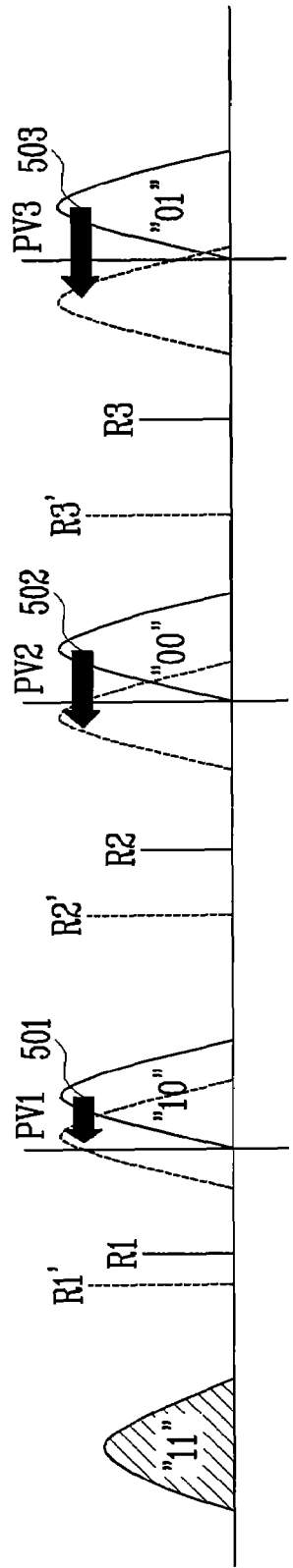

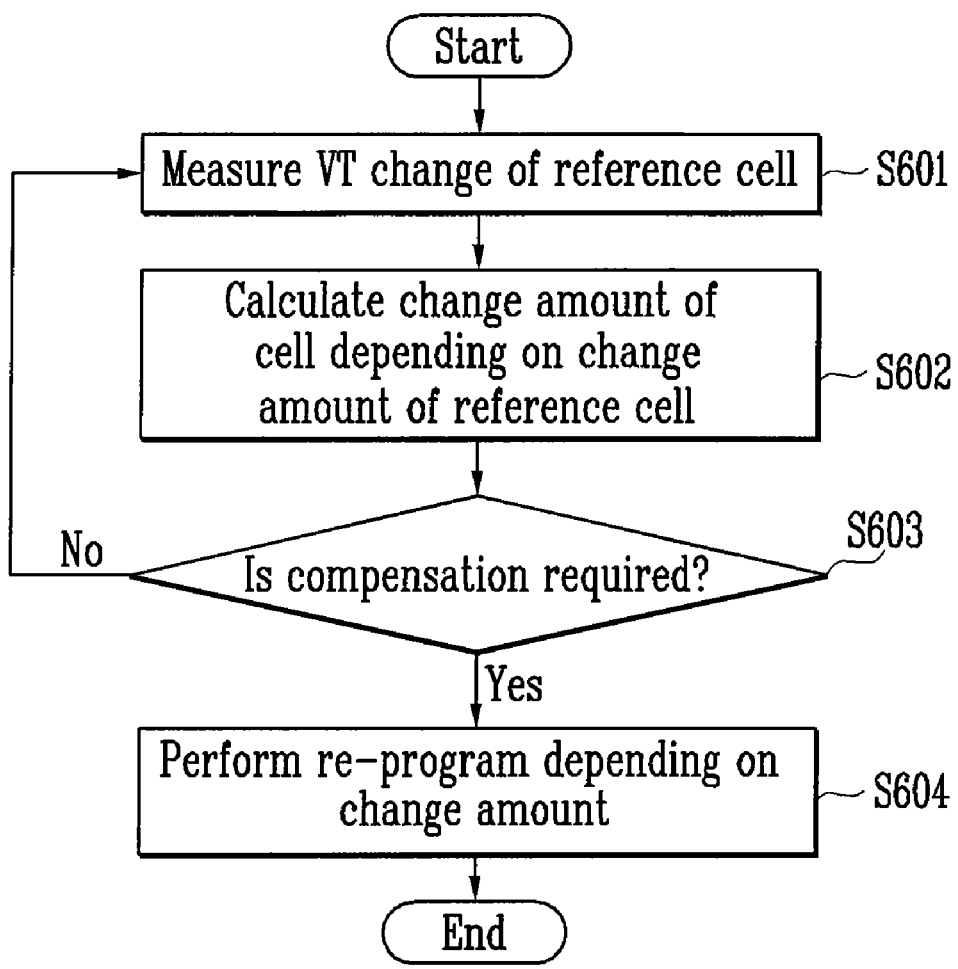

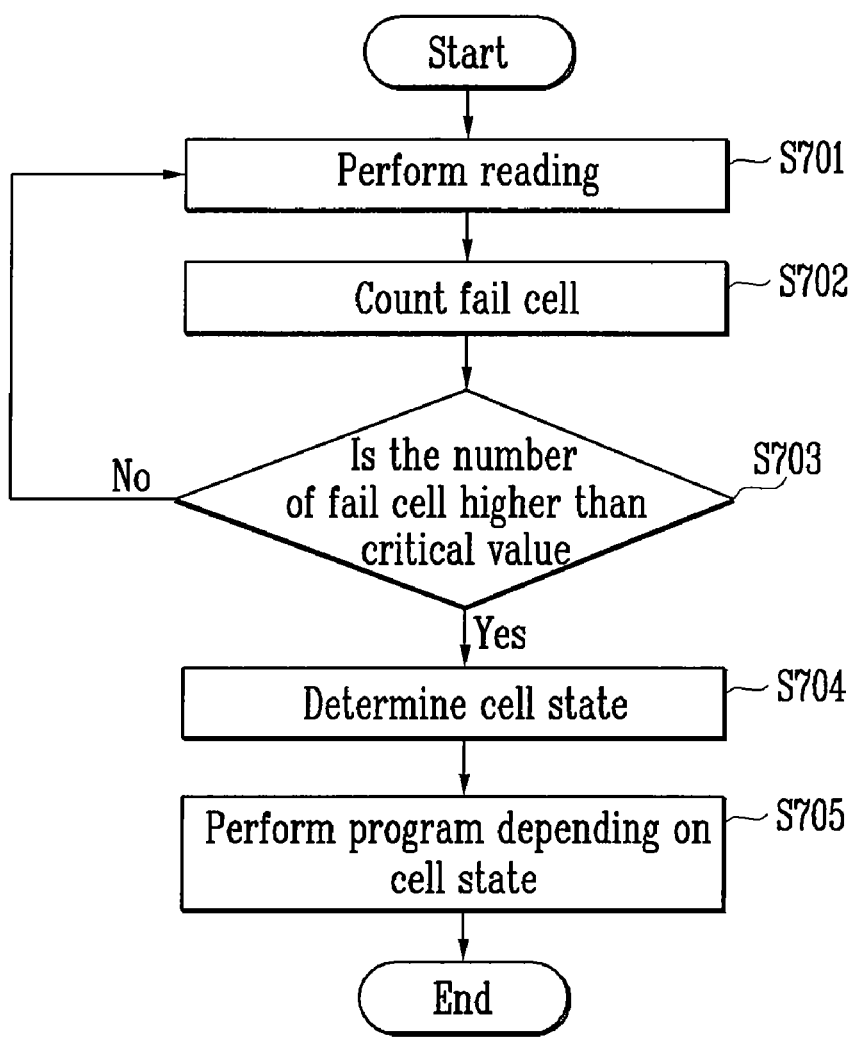

NON-VOLATILE MEMORY DEVICE AND SELF-COMPENSATION METHOD THEREOF

CROSS-REFERENCES TO RELATED APPLICATIONS

The present application claims priority to Korean patent application number 10-2006-134812, filed on Dec. 27, 2006, which is incorporated by reference in its entirety.

BACKGROUND OF THE INVENTION

The present invention relates to a non-volatile memory device and, more particularly, to a non-volatile memory device and a method to compensate for a threshold voltage shift.

Flash memory that is non-volatile is classified into NAND flash memory or NOR flash memory. NOR flash memory has a structure in which memory cells are independently connected to a bit line and a word line and has a good random access temporal characteristic, whereas NAND flash memory has a structure in which a plurality of memory cells are connected in series, requiring only one contact per cell string, and is good in terms of the level of integration. Accordingly, the NAND structure is generally used in high-integrated flash memory.

The well-known NAND flash memory device includes a memory cell array, a row decoder and a page buffer. The memory cell array consists of a plurality of word lines extending along the rows, a plurality of bit lines extending along the columns, and a plurality of cell strings corresponding to the bit lines.

In recent years, in order to further improve the level of integration in flash memory, active research has been done into a multi-bit cell capable of storing a plurality of data bits into one memory cell. This kind of the memory cell is generally referred to as a "Multi-Level Cell (MLC)". A memory cell of a single bit is referred to as a "Single-Level Cell (SLC)".

The NAND flash memory may have an error due to changed characteristics as it operates for a long time.

FIG. 1 illustrates cell distributions in a MLC with the changed threshold voltage.

Referring to FIG. 1, a MLC memory device that can store 2-bit data can have four cell states, which represents data [11], [10], [00] and [01]. The respective cells are distributed depending on a program voltage. A cell having the state [11] refers to a cell that has not been programmed, and a cell having the state [10] refers to a cell that has been programmed to have a threshold voltage slightly higher than a first program voltage PV1.

Furthermore, a cell having the state [00] has a threshold voltage slightly higher than a second program voltage PV2, and a cell having the state [01] has a threshold voltage slightly higher than a third program voltage PV3.

Furthermore, in order to read the respective cells, first to third read voltages R1 to R3 are applied to determine cell states, so that programmed data can be confirmed.

Meanwhile, in NAND flash memory, an operating voltage should be set in order to secure a retention characteristic. That is, the threshold voltage of cells can change as the memory device is operated for a long period of time and the same data is retained. Therefore, a method of reducing error by setting the voltage of a cell from the beginning and performing program and read operations based on the characteristics has been developed.

If the program and erase operations of the MLC memory device are repeated, electrons are trapped between oxide layers between the floating gate and the substrate of the memory cell, increasing trap charges. The trap charges are detrapped as time goes and temperature rises, reducing the threshold voltage of a programmed cell. Accordingly, a program voltage, is set higher than a read voltage by taking the reduction of the threshold voltage into consideration (It can be seen from FIG. 1 that the program voltage is set higher than the read voltage).

However, as the threshold voltage is shifted lower, the threshold voltage can become lower than the read voltage, resulting in read errors. A fail phenomenon occurring due to this problem is called "retention fail". Therefore, in order to prevent a retention fail, the threshold voltage must be increased, which needs to increase a pass bias for turning on unselected cells.

The increase of the pass bias causes a phenomenon in which the threshold voltage of an erased cell of unselected cells is increased, so that the threshold voltage of an unselected cell is abnormally increased. This phenomenon leads to a fail when there is a subsequent read operation. This is called "read disturb fail" caused by a read disturb.

A shift in the threshold voltage, causing the retention fail and the read disturb fail, is indicated by the dotted lines of FIG. 1.

SUMMARY OF THE INVENTION

The present invention relates to a non-volatile memory device and a self-compensation method thereof, in which the threshold voltage of a cell can be compensated for in order to prevent a fail due to a change in the threshold voltage of the cell.

According to an aspect of the present invention, there is provided a non-volatile memory device, including a memory cell array including one or more blocks respectively having a plurality of memory cells, and reference cells with respect to each block, a X decoder and a Y decoder for selecting a memory cell for an operation, of memory cell arrays, according to an input address, page buffers for programming data into a memory cell selected by the X decoder and the Y decoder or reading programmed data, and a controller for controlling the memory cell array, the X decoder, the Y decoder and the page buffers to calculate a change in a threshold voltage of the memory cells and compensate for a changed threshold voltage of a memory cell based on a change in a threshold voltage of the reference cell.

According to another aspect of the present invention, there is provided a non-volatile memory device, including a memory cell array including one or more blocks respectively having a plurality of memory cell, a X decoder and a Y decoder for selecting a memory cell for an operation, of memory cell arrays, according to an input address, page buffers for programming data into a memory cell selected by the X decoder and the Y decoder or reading programmed data, and a controller for controlling the memory cell array, the X decoder, the Y decoder and the page buffers to perform a periodic read operation on memory cells included in each block of the memory cell array, and to compensate for a changed threshold voltage of a memory cell by determining whether the number of memory cells in which fail has occurred is higher than a critical value.

According to further another aspect of the present invention, there is provided a self-compensation method of a non-volatile memory device including a memory cell array having one or more blocks respectively having a plurality of memory cells, the method including the steps of measuring a change amount of a threshold voltage of a preset reference cell, calculating a change amount of a threshold voltage of a memory cell depending on the measured change amount of the reference cell, determining whether self-compensation is required based on the calculated change amount of the threshold voltage of the memory cell, and if, as a result of the determination, self-compensation is required, performing re-programming using a program voltage set according to a program state of a memory cell.

According to still another aspect of the present invention, there is provided a self-compensation method of a non-volatile memory device including a memory cell array having one or more blocks respectively having a plurality of memory cells, the method including the steps of measuring a change amount of a threshold voltage of a preset reference cell, calculating a change amount of a threshold voltage of a memory cell depending on the measured change amount of the reference cell, determining whether self-compensation is required based on the calculated change amount of the threshold voltage of the memory cell, and if, as a result of the determination, self-compensation is required, a read voltage is changed and set according to the change amount of the threshold voltage of the memory cell.

According to still another aspect of the present invention, there is provided a self-compensation method of a non-volatile memory device including a memory cell array having one or more blocks respectively having a plurality of memory cells, the method including the steps of reading data of the plurality of memory cells according to a preset cycle, counting the number of memory cells in which fail has occurred in the read step, determining whether the number of memory cells in which fail has occurred is higher than a critical value, and if, as a result of the determination, the number of memory cells in which fail has occurred is higher than the critical value, performing re-programming using a program voltage set according to a program state of a memory cell.

According to still another aspect of the present invention, there is provided a self-compensation method of a non-volatile memory device including a memory cell array having one or more blocks respectively having a plurality of memory cells, the method including the steps of reading data of the plurality of memory cells according to a preset cycle, counting the number of memory cells in which fail has occurred in the read step, determining whether the number of memory cells in which fail has occurred is higher than a critical value, and if, as a result of the determination, the number of memory cells in which fail has occurred is higher than the critical value, a read voltage is changed and set according to a change of the threshold voltage of the memory cell.

BRIEF DESCRIPTION OF THE DRAWINGS

FIG. 4 is a view illustrating cell distributions when a first embodiment for cell voltage compensation is performed in the present invention;

FIG. 5 is a view illustrating cell distributions when a second embodiment for cell voltage compensation is performed in the present invention;

FIG. 6A is a flowchart illustrating a method of detecting a change in cell voltage and performing cell voltage compensation employing the first embodiment according to a first embodiment of the present invention;

FIG. 7A is a flowchart illustrating a method of detecting a change in cell voltage and performing cell voltage compensation employing the first embodiment according to a second embodiment of the present invention.

DETAILED DESCRIPTION OF EMBODIMENTS

Specific embodiments according to the present patent will be described with reference to the accompanying drawings.

Figure 1:
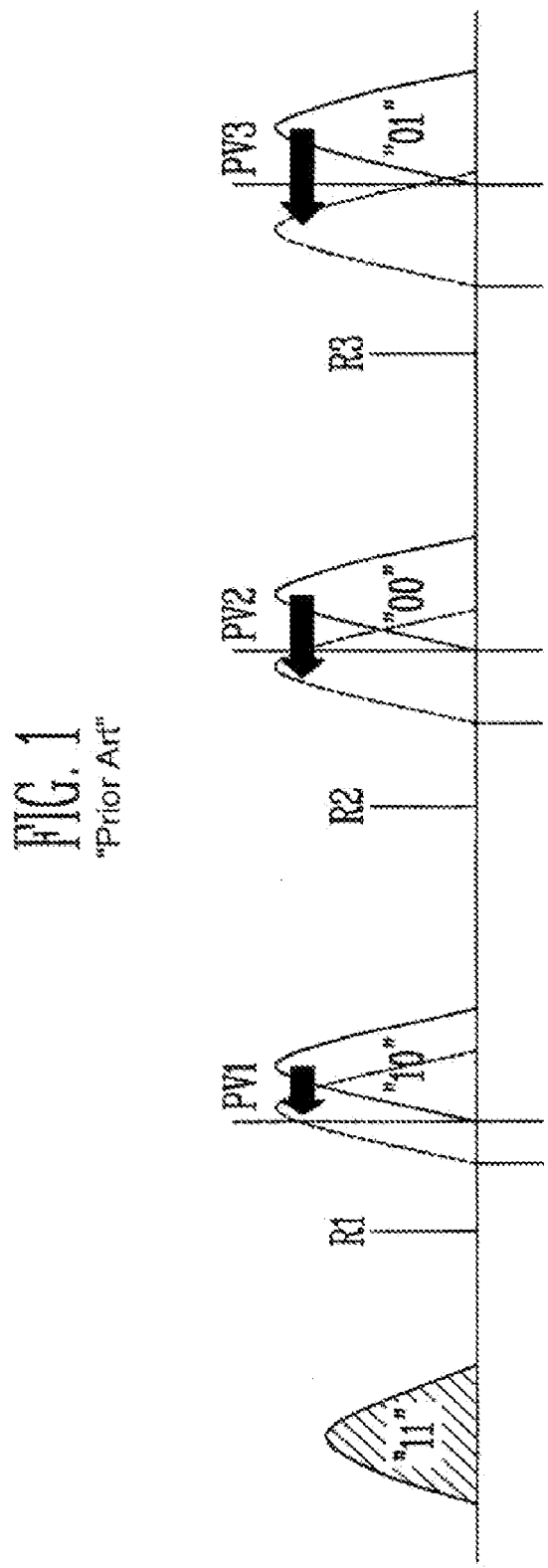
FIG. 1 illustrates cell distributions after a change of the threshold voltage of a MLC.
Figure 2:
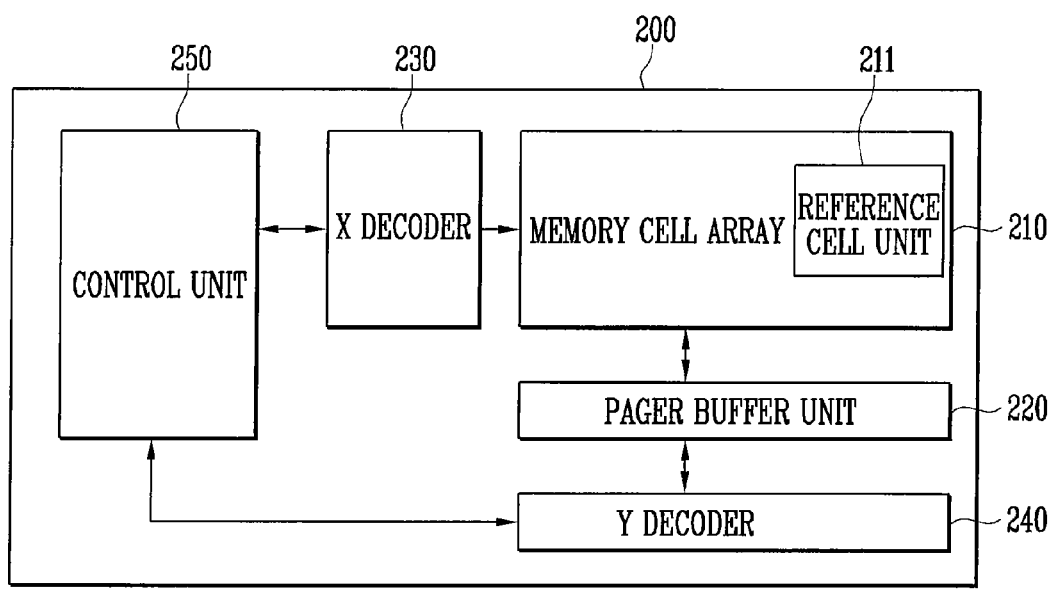
FIG. 2 is a block diagram showing the construction of NAND flash memory according to a first embodiment of the present invention.

Referring to FIG. 2, a NAND flash memory 200 according to a first embodiment of the present invention includes a memory cell array 210 having memory cells for storing data, an X decoder 230 and a Y decoder 240 for selecting the memory cells of the memory cell array 210 in response to an input address, a page buffer unit 220 having page buffers for programming data into the memory cell array 210 or reading stored data, a control unit 250 for controlling programming and reading by controlling the memory cell array 210, the page buffer unit 220, the X decoder 230 and the Y decoder 240. It is to be noted that FIG. 2 only shows a partial construction of the NAND flash memory according to a first embodiment of the present invention.

The memory cell array 210 includes a plurality of blocks having a plurality of memory cells, and includes a reference cell unit 211 having a reference cell for estimating a change in the threshold voltage of memory cells of each block.

Reference cells included in the reference cell unit 211 are used to estimate a change in the threshold voltage of a cell with respect to each block.

The control unit 250 periodically detects a change in the threshold voltage of the reference cell of the reference cell unit 211, and calculates a change amount of the threshold voltage of memory cells of a corresponding block depending on a change amount of the threshold voltage of the reference cell.

Furthermore, a method of confirming a change in the threshold voltage of the memory cells in the first embodiment can be substituted with a method according to a second embodiment, where determining whether a fail of a certain level or higher has occurred by periodically reading data of the memory cells of the memory cell array 210.

Figure 3A:
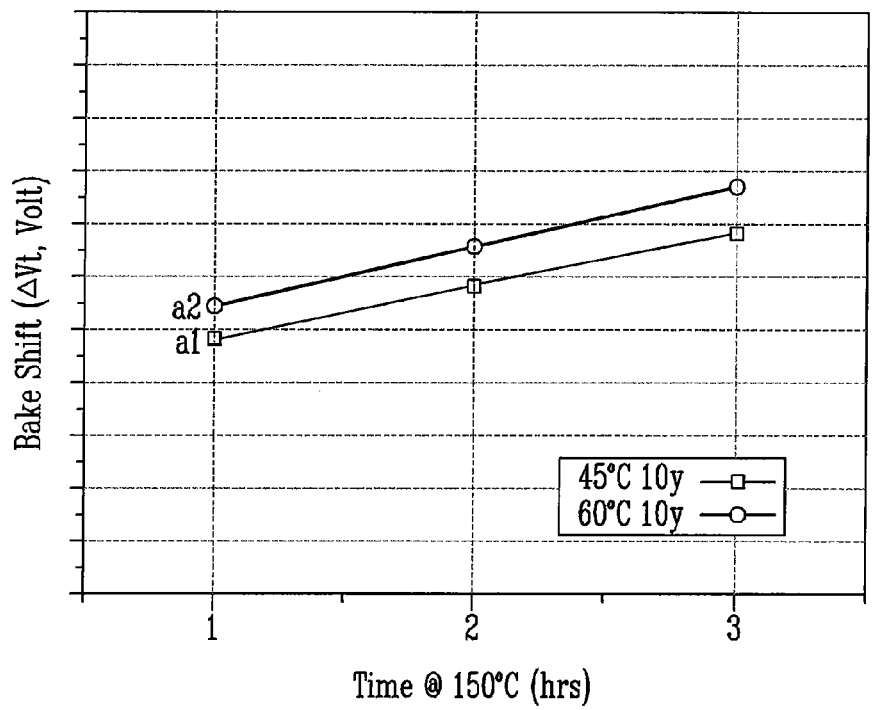
FIG. 3A is a graph showing cell voltage, which is changed depending on the operating cycle of the NAND flash memory.

FIG. 3A is a graph showing cell voltage, which is changed depending on the operating cycle of the NAND flash memory. The figure shows a change in the threshold voltage of a cell a1 having a first threshold voltage, and a cell a2 having a second threshold voltage. The cell a2 having a higher threshold voltage than the cell a1 experiences greater shift in the threshold voltage over time.

Figure 3B:
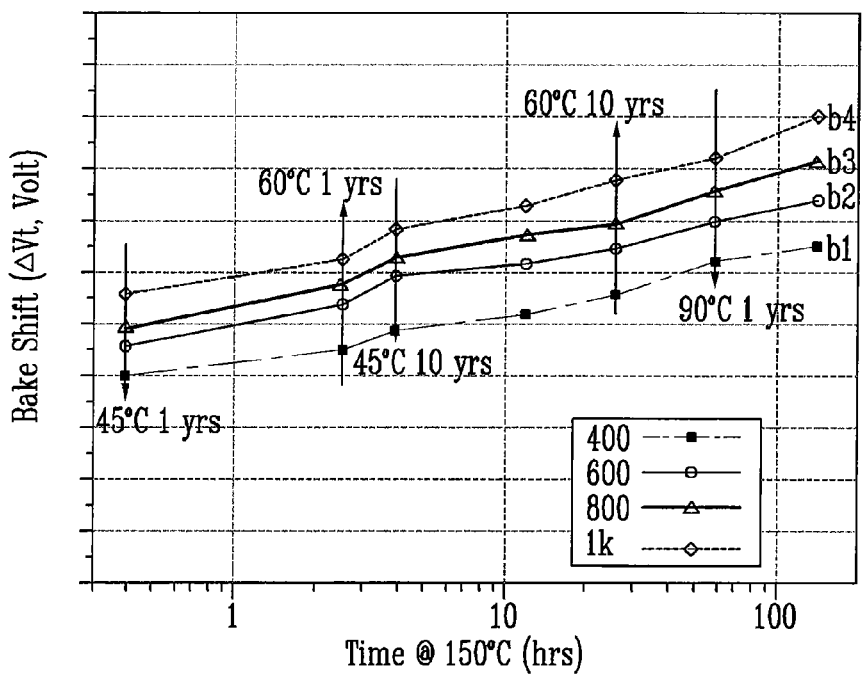
FIG. 3B is a graph showing a change in cell voltage depending on an operating cycle in each cell state of a MLC.

FIG. 3B is a graph showing a change in cell voltage depending on an operating cycle in each cell state of a MLC. The figure shows a change in the threshold voltage of cells b1 to b4 in different states, where each state has a different threshold voltage. The cell b1 represents a cell on the state [11], the cell b2 represents a cell in the state [10], the cell b3 represents a cell having the state [00], and the cell b4 represents a cell having the state [01]. The threshold voltages of the cells have the following relationship: $V_{T1}$ of the cell b1<$V_{T2}$ the cell b2<$V_{T3}$ the cell b3<$V_{T4}$ of the cell b4. FIG. 3B shows that the cells with the higher the threshold voltage experience greater shift (i.e., the reduction) in the threshold voltage.

A shift rate of the threshold voltage resembles a linear function. One embodiment of the present invention relates to calculating the change in the threshold voltage of the memory cells by examining the amount of change in the threshold voltage of a reference cell. An appropriate compensation is made to the threshold voltage of the memory cell using this calculation. In one implementation, the calculation is made using the data obtained from and FIGS. 3A and 3B.

A change in the threshold voltage may be compensated in various ways. One method includes re-programming the cell using the original program voltage. Another method involves calculating the amount of change in the threshold voltage and then compensates for the change by using a modified read voltage based on the calculated threshold voltage change.

FIG. 4 illustrates the use of a reprogramming process to handle the shift in the cell distribution due to the retention issue according to one embodiment of the present invention. The cell experiences a shift in the threshold voltage over time as more and more electrons in the floating gate escape. The cell distributions may change as indicated by dotted lines (see arrows 401 to 403). A read fail may occur if these cells with the distribution shift are read using the original read voltages R1 to R3. The cells, therefore, are reprogrammed to shift the threshold voltages back toward the original cell distributions (see arrows 411 to 413). The program voltages used may be the original program voltages PV1 to PV3. The program voltages are selected according to the program state of each cell. This compensation step allows the memory cells to be read using the original read voltages R1 to R3 without experiencing a read fail during a read process. It was done before and not new. The process for reprogramming the cells to handle retention issuer is merely used once, but it affect the memory cells not experiencing a read fail during the read process.

FIG. 5 illustrates the use of modified read voltages to handle the retention issue (i.e., the shift in the threshold voltage over time) according to another embodiment of the present invention. If a determination is made that the threshold voltages of a cell have shifted (see arrows 501 to 503), the read voltages are changed from the original read voltages R1 to modified read voltages R3 to R1' to R3' to prevent a read fail. The embodiments illustrated in FIGS. 4 and 5 may be used separately or in combination.

FIG. 6A is a flowchart illustrating a method of detecting a change in cell voltage by employing a reference cell according to a first embodiment of the present invention, as illustrated in FIG. 2, and compensating for a changed cell voltage by re-programming the cell.

At step S601, a threshold voltage (VT) of a reference cell is measured in order to determine whether the threshold voltage of memory cells included in a block of a memory cell array 210 has been changed enough to require compensation. The amount of change in the threshold voltage of the memory cell is then calculated (step S602). The calculation is based on the threshold voltage change of the reference cell that has been measured at step 602 and the information that the threshold voltage change of the memory cell has a linear relationship to the threshold voltage change of the reference cell, as explained above in connection with FIGS. 3A and 3B.

The calculation of the threshold voltage change in step S602 is used to determine whether or not the cell requires a compensation step (step S603). If compensation is required in step S603, reprogramming is performed by applying the program voltages PV1 to PV3 depending on the program state of the memory cell (step S604). The cell distributions are brought back to a normal state.

Figure 6B:
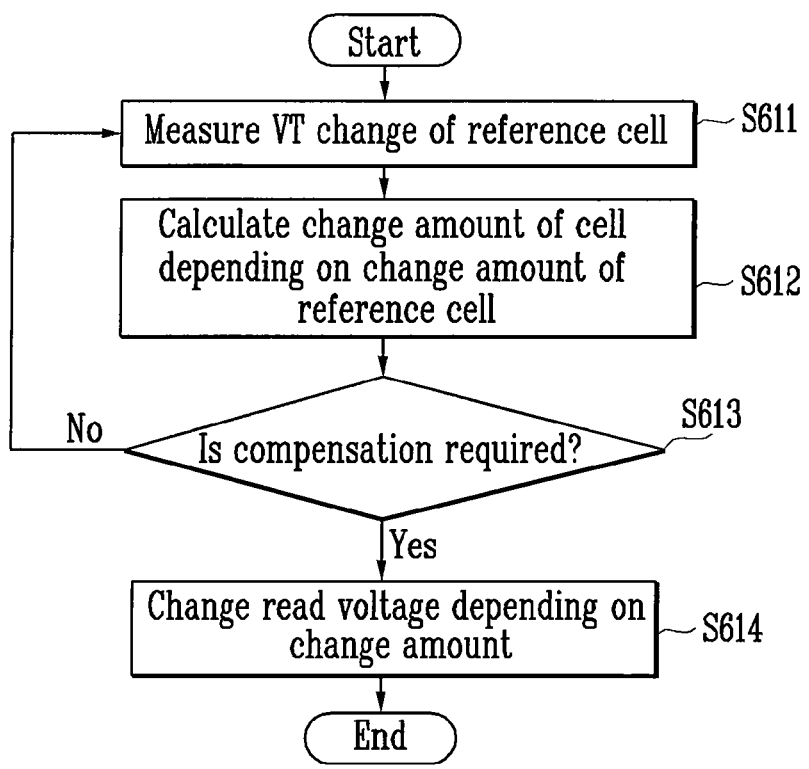
FIG. 6B is a flowchart illustrating a method of detecting a change in cell voltage and performing cell voltage compensation employing the second embodiment according to a first embodiment of the present invention.

FIG. 6B is a flowchart illustrating a method of compensating for a threshold voltage change according to another embodiment of the present invention. The method involves changing the read voltages as part of the compensation step, as explained below.

At step S611, a threshold voltage (VT) of a reference cell is measured. The amount of change in the threshold voltage of the memory cell is then calculated (step S612). The calculation is based on the threshold voltage change of the reference cell that has been measured at step 612 and the information that the threshold voltage change of the memory cell has a linear relationship to the threshold voltage change of the reference cell, as explained above.

The calculation of the threshold voltage change in step S612 is used to determine whether or not the memory cell requires a compensation step (step S613) to prevent a read fail. If it is determined that the compensation step is required, a new read voltage is set based on the amount of the threshold voltage change of the memory cell as calculated in step S613 (step S614).

The new read voltage is set in the control unit (see FIG. 2), so that a voltage whose read voltage has been changed is applied to a corresponding memory cell. Accordingly, a read fail can be avoided.

FIG. 7A is a flowchart illustrating a method of detecting a change in cell voltage and performing cell voltage compensation according to another embodiment of the present invention. The embodiment reads memory cells periodically to determine whether or not compensation is required by counting the number of memory cells experiencing a read fail.

At step S701, the control unit or controller (see FIG. 2) of the flash memory device periodically reads data stored in the memory cells. The number of memory cells that has experienced a read fail is counted (step S702). If the number of memory cells with a read fail is higher than a preset value, the control unit determines that the threshold voltage of the memory cells needs a compensation step (step S703). The program states of the memory cells are determined (step S704). The memory cells are reprogrammed using appropriate program voltages based on their program states (step S705).

In one embodiment, the cell experiencing a fail is reprogrammed to a state that is most likely to be the program state of the cell. For example, referring to FIG. 4, if it is determined that a cell that has failed is between the state [00] or [01], the cell is reprogrammed to the state whose threshold voltage level is closer the cell that has failed, i.e., to the state [01] (see arrow 413).

Figure 7B:
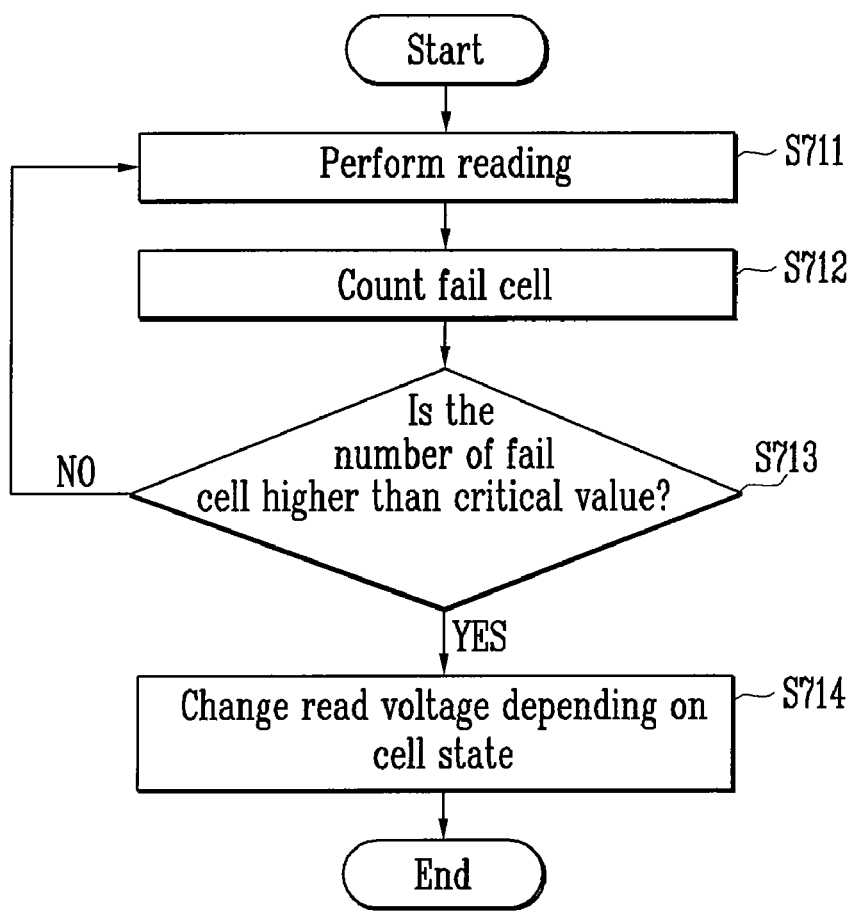
FIG. 7B is a flowchart illustrating a method of detecting a change in cell voltage and performing cell voltage compensation employing the second embodiment according to a second embodiment of the present invention.

FIG. 7B is a flowchart illustrating a method of detecting a change in cell voltage and performing cell voltage compensation according another embodiment of the present invention.

At step S711, the control unit or controller (see FIG. 2) of the flash memory device periodically reads data stored in the memory cells. The number of memory cells that has experienced a read fail is counted (step S712). If the number of memory cells with a read fail is higher than a preset value, the control unit determines that the threshold voltage of the memory cells needs a compensation step (step S713). The control unit sets new read voltages according to the program states of the cells (step S714).

At this time, the read voltage can be changed by setting the read voltage applied thereto in such a manner that the change amount of the threshold voltage is estimated if the number of memory cells with a read fail is the preset value on average.

As described above, in accordance with a non-volatile memory device and a self-compensation method thereof according to the present invention, a change in the threshold voltage, which is generated as a memory cell repeatedly performs program and reading, a change in the threshold voltage with respect to data that has been stored for a long time, and so on are detected, and self compensation is performed. Accordingly, the reliability of a non-volatile memory device can be increased.

Although the foregoing description has been made with reference to specific embodiments, it is to be understood that changes and modifications of the present patent may be made by the ordinary skilled in the art without departing from the spirit and scope of the present patent and appended claims.

What is claimed is:

1. A non-volatile memory device, comprising:
   a memory cell array including one or more blocks, each block having a plurality of memory cells and at least one reference cell;
   an X decoder and a Y decoder for selecting a memory cell for an operation according to an input address;
   at least one page buffer for programming data into a memory cell selected by the X decoder and the Y decoder, or reading data programmed in the memory cell selected by the X decoder and the Y decoder; and
   a controller for controlling the memory cell array, the X decoder, the Y decoder, and the page buffer, the controller being configured to calculate a change in a threshold voltage of the memory cells in the block and initiate a step to compensate for the changed threshold voltage, wherein the calculation of the change in the threshold voltage being based on a change in a threshold voltage of the reference cell.

2. The non-volatile memory device of claim 1, wherein the controller initiates reprogramming of the memory cells in the block as the compensation step based on information obtained from the calculation of the change in the threshold voltage of the reference cell.

3. The non-volatile memory device of claim 1, wherein the controller adjusts read voltage levels of the memory cells in the block as the compensation step based on information obtained from the calculation of the change in the threshold voltage of the reference cell.

4. A non-volatile memory device, comprising:
   a memory cell array including one or more blocks, each block having a plurality of memory cell;
   an X decoder and a Y decoder configured to select a memory cell for an operation according to an input address;
   at least one page buffer configured to program data into or read data from a memory cell selected by the X decoder and the Y decoder; and
   a controller configured to control the memory cell array, the X decoder, the Y decoder, and the page buffer, the controller being configured to perform a periodic read operation on one or more memory cells in each block of the memory cell array, and to perform a compensation step on the memory cells in the block if the periodic read indicates that the memory cells in the block has a high fail rate.

5. The non-volatile memory device of claim 4, wherein the block is considered to have the high fail rate if the number of memory cells that has a fail during the periodic read is equal to or higher than a reference value.

6. The non-volatile memory device of claim 4, wherein the controller initiates reprogramming of the memory cells in the block as the compensation step.

7. The non-volatile memory device of claim 4, wherein the controller adjusts read voltage levels of the memory cells in the block as the compensation step.

8. A method for operating a non-volatile memory device including a memory cell array having at least one block having a plurality of memory cells, the method comprising:
   measuring a change in a threshold voltage of a reference cell associated with the block;
   calculating a change in a threshold voltage of a memory cell in the block using the change measured in the measuring step; and
   performing a compensation step on the memory cells of the block based on information obtained from the calculating step.

9. The method of claim 8, wherein the memory cells in the block are reprogrammed as part of the compensation step.

10. The method of claim 8, wherein read voltage levels of the memory cells in the block are adjusted as part of the compensation step.

11. The method of claim 8, wherein the calculating step associates a linear function to the change in the threshold voltage of the reference cell to calculate the change in the threshold voltage of the memory cell of the block.

12. The method of claim 8, wherein the calculated change in the threshold voltage of the memory cell is compared with a reference value to determine whether or not the compensation step is to be performed.

13. A method of operating a non-volatile memory device including a memory cell array having at least one block having a plurality of memory cells, the method comprising:
   measuring a change in a threshold voltage of a reference cell associated with the block;
   calculating a change in a threshold voltage of a memory cell in the block using the change measured in the measuring step;
   determining a compensation step is to be performed based on information obtained from the calculating step; and
   performing the compensation step on the memory cells of the block based on a result obtained from the determining step.

14. The method of claim 13, wherein the change in the threshold voltage of the memory cell in the block is calculated by associating the change in the threshold voltage of the reference cell to a linear function.

15. The method of claim 13, wherein the determining step includes comparing the calculated amount to a reference value to determine whether or not the compensation step is needed.

16. The method of claim 13, wherein reprogramming of the memory cells in the block is performed as the compensation step.

17. A method of a non-volatile memory device including a memory cell array having at least one block having a plurality of memory cells, the method comprising:
   reading data stored in the memory cells of the block;
   counting the number of the memory cells that has a fail during the read step;

determining whether the number of memory cells in which fail has occurred is higher than a critical value; and reprogramming the memory cells of the block using a program voltage set according to program states of the memory cells in the block if the number of the memory cells is equal to or greater than the critical value.

18. The method of claim 17, wherein the non-volatile memory device is a NAND flash memory device.

19. The method of claim 17, wherein the non-volatile memory device is a NOR flash memory device.

* * * * *